(12) United States Patent
Ohe et al.

(10) Patent No.: US 8,304,763 B2
(45) Date of Patent: Nov. 6, 2012

(54) THIN-FILM SEMICONDUCTOR DEVICE AND FIELD-EFFECT TRANSISTOR

(75) Inventors: Takahiro Ohe, Tokyo (JP); Miki Kimijima, Tokyo (JP)

(73) Assignee: Sony Corporation, Tokyo (JP)

( * ) Notice: Subject to any disclaimer, the term of this patent is extended or adjusted under 35 U.S.C. 154(b) by 326 days.

(21) Appl. No.: 12/735,129

(22) PCT Filed: Oct. 17, 2008

(86) PCT No.: PCT/JP2008/068843
§ 371 (c)(1),
(2), (4) Date: Jun. 17, 2010

(87) PCT Pub. No.: WO2009/084307
PCT Pub. Date: Jul. 9, 2009

(65) Prior Publication Data
US 2010/0276754 A1    Nov. 4, 2010

(30) Foreign Application Priority Data
Dec. 27, 2007  (JP) ................................. 2007-335881

(51) Int. Cl.
*H01L 29/08* (2006.01)
(52) U.S. Cl. .................. 257/40; 257/347; 257/E51.005
(58) Field of Classification Search .......... 257/E51.005, 257/40, 347
See application file for complete search history.

(56) References Cited

U.S. PATENT DOCUMENTS
7,851,788 B2 * 12/2010 Ohta ............................. 257/40

FOREIGN PATENT DOCUMENTS
| JP | 03-217027 | 9/1991 |
| JP | 03-255669 | 11/1991 |
| JP | 2006-093113 A | 4/2006 |
| JP | 2007-273594 A | 10/2007 |

OTHER PUBLICATIONS

Bao, Zhenan et al., "Soluble and processable regioregular poly(3-hexylthiophene) for thin film field-effect transistor application with high mobility", Applied Physics Letters, vol. 69, Issue 26, 1996, p. 4108-4110.

* cited by examiner

*Primary Examiner* — Kevin M Picardat
*Assistant Examiner* — Paul Patton
(74) *Attorney, Agent, or Firm* — Wolf, Greenfield & Sacks, P.C.

(57) ABSTRACT

A semiconductor thin film (1) that is laminated on a gate electrode (13) with a gate insulation film (15) therebetween is included. The semiconductor thin film (1) has a layered structure and includes at least two semiconductor layers (a, a'). In the semiconductor thin film (1), for example, an intermediate layer (b) composed of a material different from the two semiconductor layers (a, a') is sandwiched between the semiconductor layers (a, a'). The two semiconductor layers (a, a') are composed of an identical material and the intermediate layer (b) is composed of an insulation material. A material constituting such a layered structure is composed of an organic material. Thus, a thin-film semiconductor device and a field-effect transistor in which a decrease in the mobility caused by heating and degradation of characteristics caused by the decrease can be suppressed and the heat resistance is enhanced are provided.

10 Claims, 7 Drawing Sheets

FIG. 14

# THIN-FILM SEMICONDUCTOR DEVICE AND FIELD-EFFECT TRANSISTOR

TECHNICAL FIELD

The present invention relates to a thin-film semiconductor device and a field-effect transistor, in particular, to a thin-film semiconductor device and a field-effect transistor in which degradation of characteristics caused by heating is suppressed.

BACKGROUND ART

In the production of a thin-film semiconductor device in which an organic semiconductor thin film is used such as an organic thin-film transistor (organic TFT), the film-formation of the organic semiconductor thin film to which coating and printing processes are applied is possible. For example, a solution in which an organic semiconductor material has been dissolved in a solvent is coated on a substrate and dried to thereby obtain an organic semiconductor thin film composed of a single-component organic semiconductor material. Thus, an increase in the size of substrates and a decrease in the production cost can be achieved compared with a semiconductor device in which conventional inorganic semiconductor materials such as silicon (Si) are used. Furthermore, since coating and printing processes and the like have low process temperature, formation on plastic substrates is possible and semiconductor devices having flexibility are also expected. As such an example, it has been reported that a backplane in which an organic TFT is provided on a plastic substrate is produced and a flat-panel type display apparatus such as a liquid-crystal display apparatus or an OLED display apparatus is produced with the backplane.

As for materials for constituting organic semiconductor thin films, various materials such as polythiophene, pentacene, and rubrene have been under study. It has been reported that there is a material that has a mobility equal to or more than that of a thin-film semiconductor device in which a semiconductor thin film composed of amorphous silicon is used (for example, refer to Non-Patent Document ("Applied Physics Letters", {HYPERLINK "http://scitation.aip.org/dbt/dbt.jsp?KEY=APPLAB&Volume=69"}, Volume 69}, Issue 26, 1996, p. 4108-4110)).

DISCLOSURE OF INVENTION

However, a thin-film semiconductor device in which an organic semiconductor thin film is used has a problem of degradation of the mobility caused by heating. In an actual experiment, it has been confirmed that a mobility of 0.14 $cm^2/Vs$ before being heated became a mobility of $6\times10^{-4}$ $cm^2/Vs$ in the state of being heated to 180° C. under a nitrogen atmosphere and the mobility is degraded by heating to 1/100 or less. Note that the organic semiconductor material is not oxidized by heating under a nitrogen atmosphere and furthermore the organic semiconductor material used itself is not thermally decomposed by heating to 180° C. Thus, it is understood that such degradation of the mobility caused by heating is not caused by alteration of the organic semiconductor material itself.

Accordingly, an object of the present invention is to provide a thin-film semiconductor device and a field-effect transistor in which a decrease in the mobility caused by heating and degradation of characteristics caused by the decrease can be suppressed and the heat resistance is enhanced.

A thin-film semiconductor device according to the present invention for achieving the object includes a semiconductor thin film laminated on a gate electrode with a gate insulation film therebetween, and is characterized in that the semiconductor thin film has a layered structure and includes at least two semiconductor layers.

Furthermore, a field-effect transistor according to the present invention includes a semiconductor thin film laminated on a gate electrode with a gate insulation film therebetween; and a source electrode and a drain electrode provided in positions corresponding to both sides of the gate electrode so as to be in contact with the semiconductor thin film, and is characterized in that the semiconductor thin film has a layered structure and includes at least two semiconductor layers.

In a thin-film semiconductor device and a thin-film transistor that include a semiconductor thin film having such a layered structure, it has been experimentally confirmed that degradation of the mobility caused by heating can be suppressed to a small degree compared with a configuration in which a semiconductor thin film having a monolayer structure is used. Such suppression of degradation of the mobility is probably achieved because, as one cause, expansion and contraction stress of the semiconductor thin film caused by heating and cooling is suppressed by the layered structure.

BEST MODES FOR CARRYING OUT THE INVENTION

Hereinafter, embodiments of the present invention will be described in detail with reference to the drawings. Note that, hereinafter, embodiments will be described; in sequence, the configuration of a semiconductor thin film used for a thin-film semiconductor device and a field-effect transistor according to the present invention, a method for forming such a semiconductor thin film, and a thin-film semiconductor device having the configuration of a field-effect transistor in which such a semiconductor thin film is used.

<Semiconductor Thin Film>

Figure 1:
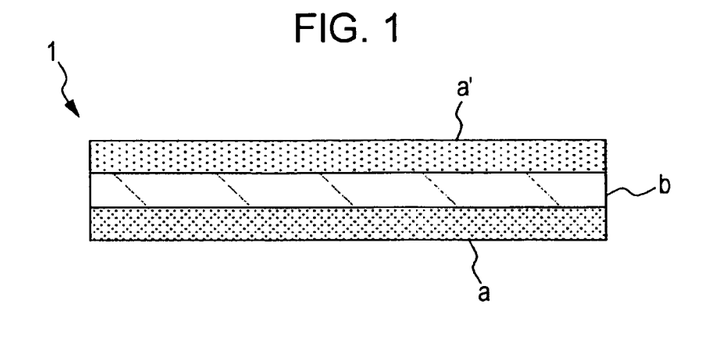
FIG. 1 is a sectional view of a semiconductor thin film applied to the present invention.

FIG. 1 is a sectional view illustrating a configuration example of a semiconductor thin film applied to the present invention. A semiconductor thin film 1 illustrated in this figure is characterized by being so-called a semiconductor composite thin film in which a layered structure includes at least two semiconductor layers a, a'. As illustrated in the figure, these semiconductor layers a, a' may be arranged such that the two semiconductor layers a-a' sandwich therebetween an intermediate layer b mainly composed of another different material. In this case, the two semiconductor layers a, a' may be composed of different materials or may be composed of an identical material.

The intermediate layer b is composed of a material different from the two semiconductor layers a, a'. The semiconductor thin film 1 including the intermediate layer b should have, as a whole, desired semiconductor properties. Accordingly, for example, the intermediate layer b may be composed of an insulation material having a lower conductivity than the two semiconductor layers a, a' or may be composed of a semiconductor material having a conductivity similar to the conductivity of the two semiconductor layers a, a'. Alternatively, the intermediate layer b of another example may be composed of a conductive material having a higher conductivity than the two semiconductor layers a, a'. Additionally, the intermediate layer b itself may be constituted by a layered structure. Furthermore, when the intermediate layer b is formed with a mixed material, a material of the semiconductor layers a, a' may be contained as a constituent material.

Alternatively, the semiconductor thin film 1 may have a configuration in which the two semiconductor layers a, a' are directly layered together. In this case, the two semiconductor layers a, a' are composed of different materials. Furthermore, in this semiconductor thin film 1, when one of the two semiconductor layers a, a' constitutes a surface of the semiconductor thin film 1, another layer may be further provided on the outside of the other of the semiconductor layers a, a'.

As a semiconductor material constituting the semiconductor layers a, a' and the intermediate layer b composed of a semiconductor material in the semiconductor thin film 1 above, an organic semiconductor material or an inorganic semiconductor material such as silicon is used. As the organic semiconductor material, a low-molecular semiconductor material such as an acene compound, an oligothiophene derivative, a phthalocyanine derivative, or a perylene derivative is suitably used. A conjugated low-molecular material should be polycrystalline or crystalline. Alternatively, the organic semiconductor material may be a high-molecular organic semiconductor material such as poly(3-hexyl-thiophene). In particular, a material constituting the semiconductor layers a, a' is preferably a conjugated-type low-molecular material. On the other hand, the intermediate layer b is preferably composed of a high-molecular material and the high-molecular material may be amorphous.

Furthermore, as the insulation material constituting the intermediate layer b, an organic insulation material or an inorganic insulation material such as silicon oxide is used. The organic insulation material may be a low-molecular material or a high-molecular material and may be crosslinked or not when a crosslinking reaction can occur. A high-molecular insulation material is preferred. As such a material, polystyrene, polycarbonate, polydimethylsiloxane, nylon, polyimide, a cyclic olefin-copolymer, an epoxy polymer, cellulose, polyoxymethylene, a polyolefin-based polymer, a polyvinyl-based polymer, a polyester-based polymer, a polyether-based polymer, a polyamide-based polymer, a fluorine-based polymer, a biodegradable plastic, a phenol resin, an amino resin, an unsaturated polyester resin, a diallyl phthalate resin, an epoxy resin, a polyimide resin, a polyurethane resin, a silicone resin, a copolymer in which various polymer units are combined, or the like is used.

Note that each layer forming the layered structure above may be formed of a single component or the layer may be formed of a mixed material in which a plurality of materials are mixed. Furthermore, the state where layers are perfectly defined is not restrictive and materials constituting layers may be mixed with each other near the interfaces.

Then, as a particularly preferred example of the semiconductor thin film 1, semiconductor layer a in which a. polycrystalline or crystalline conjugated-type low-molecular material is used/insulating intermediate layer b in which an amorphous high-molecular material is used/semiconductor layer a' in which a polycrystalline or crystalline conjugated-type low-molecular material is used is exemplified.

As will be described in EXAMPLES below, in the semiconductor thin film 1 having a layered structure having the above configuration, it has been experimentally confirmed that degradation of the mobility caused by heating can be suppressed to a small degree compared with a semiconductor thin film having a monolayer structure.

<Method for Forming Semiconductor Thin Film—1>

As a first example of a method for forming the semiconductor thin film 1 having the above configuration, one layer after another can be sequentially formed from the lower-layer side by film formation. Coating and printing methods including spin coating, slit coating, inkjet, screen printing, letterpress printing, intaglio printing, surface printing, and the like and an evaporation method, a CVD method, a PVD method, a sputtering method, and the like may be applied to the film formation of each layer in accordance with the material. In particular, when all the layers constituting the semiconductor thin film 1 are composed of organic materials, the semiconductor thin film 1 can be obtained by a process to which a coating and printing method is applied.

<Method for Forming Semiconductor Thin Film—2>

Furthermore, as a second example of a method for forming the semiconductor thin film 1, a method can be exemplified in which organic materials are spontaneously brought into phase separation in a thin film formed by coating or printing. This method will be described below.

First, organic materials of a plurality of types including the above-described organic semiconductor material are dissolved in a solvent to prepare a mixed solution. At this time, for example, an organic material constituting the intermediate layer (for example, the above-described organic insulation material) is also dissolved in a similar solvent and mixed.

Next, the prepared solution is coated or printed onto a substrate by a coating method such as a spin-coating method, a printing method, and further an inkjet method to form a thin film. Note that, herein, a printing method is understood as one type of coating methods and thin films formed by coating methods including printing methods are certified as coating films below.

Next, by drying the coating film, the solvent in the coating film is removed and the organic materials of a plurality of types contained in the coating film are spontaneously brought into phase separation.

Thus, a semiconductor thin film having a layered structure including semiconductor layers in which the organic materials are brought into phase separation from each other and the organic semiconductor material is layered can be obtained. Additionally, when an organic insulation material is contained in the coating film, a semiconductor thin film in which an insulation layer composed of this organic insulation material is layered can be obtained. At this time, for example, the organic semiconductor material precipitates on the interface side of the coating film to constitute semiconductor layers and a semiconductor thin film in which an insulation layer is sandwiched as an intermediate layer between these two semiconductor layers can be obtained. In this case, for example, the two semiconductor layers are composed of an identical material.

Note that the spontaneous phase separation of organic materials in a coating film in the process of drying the coating film above is achieved by adjusting each molecular weight of the organic materials of a plurality of types constituting the coating film (that is, the solution). Alternatively, as another example, it is achieved by combination of organic materials of a plurality of types constituting the coating film (that is, the solution).

With the above formation method, a semiconductor thin film having a layered structure can be obtained by one-time film-formation coating. Additionally, a problem of erosion of an underlayer serving as a base upon the film formation of an upper layer of the layers is not caused.

Furthermore, it has been found that, in particular, by conducting film-formation coating (printing) with a solution that has been mixed by dissolving organic materials of a plurality of types including an organic semiconductor material in a solvent, as will be described in EXAMPLES below, coating and printing properties are enhanced and the in-plane uniformity of the resultant semiconductor thin film is also enhanced. For example, when a low-molecular material is used as an organic semiconductor material, in a solution in which this organic material has been dissolved, it is difficult to obtain a viscosity required for film-formation coating and the solution often agglomerates after being coated and dried. The agglomeration causes the film to become irregular and, as a result, it is difficult to obtain a semiconductor thin film having in-plane uniformity.

Thus, as described above, it has been confirmed that, upon the dissolution of organic materials of a plurality of types including an organic semiconductor material in a solvent, use of a high-molecular material (for example, a high-molecular insulation material) as another organic material to be used in combination with the organic semiconductor material enables adjustment of a solution having a sufficient viscosity and provides a semiconductor thin film that is less likely to agglomerate in a drying step after being coated by spin-coating, inkjet, or the like and has in-plane uniformity.

<Thin-Film Semiconductor Device—1>

Figure 2:
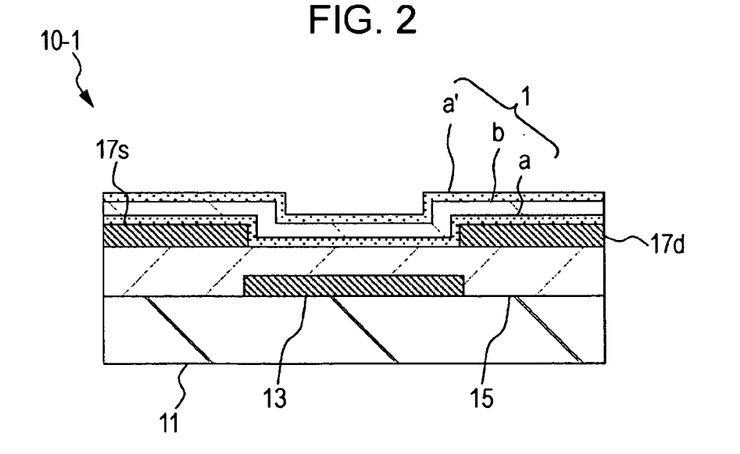
FIG. 2 is a sectional configuration view illustrating a first example of a thin-film semiconductor device to which the present invention is applied.

FIG. 2 is a sectional configuration view illustrating a first example of a thin-film semiconductor device to which the present invention is applied. A thin-film semiconductor device 10-1 illustrated in this figure is a thin-film transistor of a bottom-contact bottom-gate (BCBG) type and a field-effect transistor. In this thin-film semiconductor device 10-1, a gate electrode 13 is formed on a substrate 11 by patterning. Furthermore, a gate insulation film 15 is provided in the state of covering the gate electrode 13. A source electrode 17s and a drain electrode 17d are formed on this gate insulation film 15 by patterning. These source electrode 17s and drain electrode 17d are provided in positions corresponding to the both sides of the gate electrode 13 in the state of having the gate electrode 13 therebetween so as to face each other. There may be an overlapping region between the gate electrode and the source and drain electrodes. Furthermore, the semiconductor thin film 1 having the above-described layered structure is provided across the source electrode 17s—the drain electrode 17d in the state of being in contact with the gate insulation film 15, the source electrode 17s, and the drain electrode 17d.

Furthermore, in particular, in the present first example, one of at least two semiconductor layers constituting the above-described semiconductor thin film 1 is provided in the state of being in contact with the source electrode 17s, the gate insulation film 15, and the drain electrode 17d. Herein, for example, the semiconductor thin film 1 having a trilayer structure in which the intermediate layer b is sandwiched between the semiconductor layers a-a' is provided in the state of covering the gate insulation film 15 on which the source electrode 17s and the drain electrode 17d are formed; and the semiconductor layer a between these is provided in the state of being in contact with the source electrode 17s, the gate insulation film 15, and the drain electrode 17d. Such a semiconductor thin film 1 is formed by the formation method of the above-described first example or second example.

Herein, when all the layers constituting the semiconductor thin film 1 are composed of organic materials, the semiconductor thin film 1 can be obtained by a low-temperature process to which a printing method is applied. Thus, a plastic substrate can be used as the substrate 11. In this case, by constituting the gate insulation film 15 also with an organic material, formation by a low-temperature process to which a printing method is applied can be conducted. Furthermore, the gate electrode 13, the source electrode 17s, and the drain electrode 17d can be formed by, in addition to conventional formation of metal electrodes by a sputtering method, a CVD method, a plating method, or a deposition method, a low-temperature process by the application of a printing method such as an inkjet method, a micro-contact method, or a screen printing method in which a dispersion solution of nanoparticles such as Au or Ag, a metal complex solution, and further a conductive molecule solution are used.

Furthermore, in the thin-film semiconductor device 10-1 having such a configuration, it has been experimentally confirmed that, by using the semiconductor thin film 1 described with FIG. 1 as an active layer, degradation of the mobility caused by heating is suppressed to a small degree compared with a configuration in which a semiconductor thin film having a monolayer structure is used as an active layer. As a result, a decrease in the mobility caused by heating and degradation of characteristics caused by the decrease are suppressed and the heat resistance can be enhanced.

<Thin-Film Semiconductor Device—2>

Figure 3:
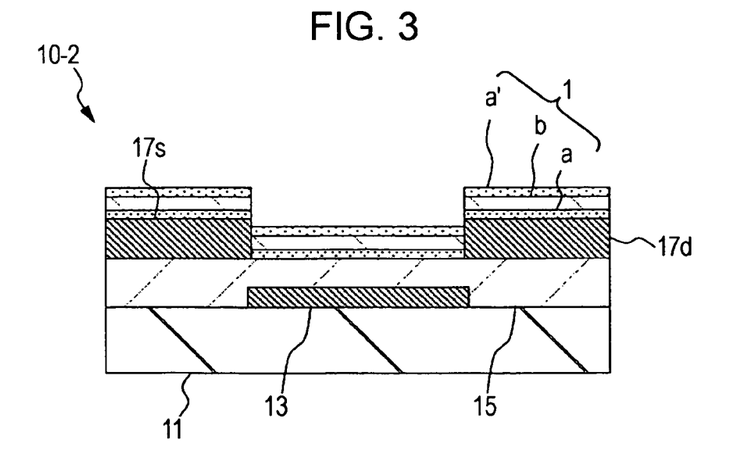
FIG. 3 is a sectional configuration view illustrating a second example of a thin-film semiconductor device to which the present invention is applied.

FIG. 3 is a sectional configuration view illustrating a second example of a thin-film semiconductor device to which the present invention is applied. A thin-film semiconductor device 10-2 illustrated in this figure is also a thin-film transistor (field-effect transistor) of the bottom-contact bottom-gate (BCBG) type. The same constitutional elements as in the thin-film transistor (10-1) illustrated in FIG. 2 are designated with identical reference symbols.

The difference of the thin-film semiconductor device 10-2 of the second example illustrated in this figure from the thin-film transistor (10-1) of the first example illustrated in FIG. 2 is a configuration in which the semiconductor thin film 1 is separated at the stepped patterns of the source electrode 17*s* and the drain electrode 17*d*. The other configuration is the same as in the first example.

Also, in such a configuration, a state is provided in which the above-described semiconductor thin film 1 is provided across the source electrode 17*s*—the drain electrode 17*d* in the state of being in contact with the gate insulation film 15, the source electrode 17*s*, and the drain electrode 17*d*; and the semiconductor layer a among the semiconductor thin film 1 having a trilayer structure is provided in the state of being in contact with the source electrode 17*s*, the gate insulation film 15, and the drain electrode 17*d*. Note that the semiconductor layer a is in contact with the source electrode 17*s* and the drain electrode 17*d* only in the end surfaces of the semiconductor layer a.

Thus, also, in the thin-film semiconductor device 10-2 having such a configuration, by using the semiconductor thin film 1 described with FIG. 1 as an active layer, a decrease in the mobility caused by heating and degradation of characteristics caused by the decrease are suppressed and the heat resistance can be enhanced as in the first example.

<Thin-Film Semiconductor Device—3>

Figure 4:
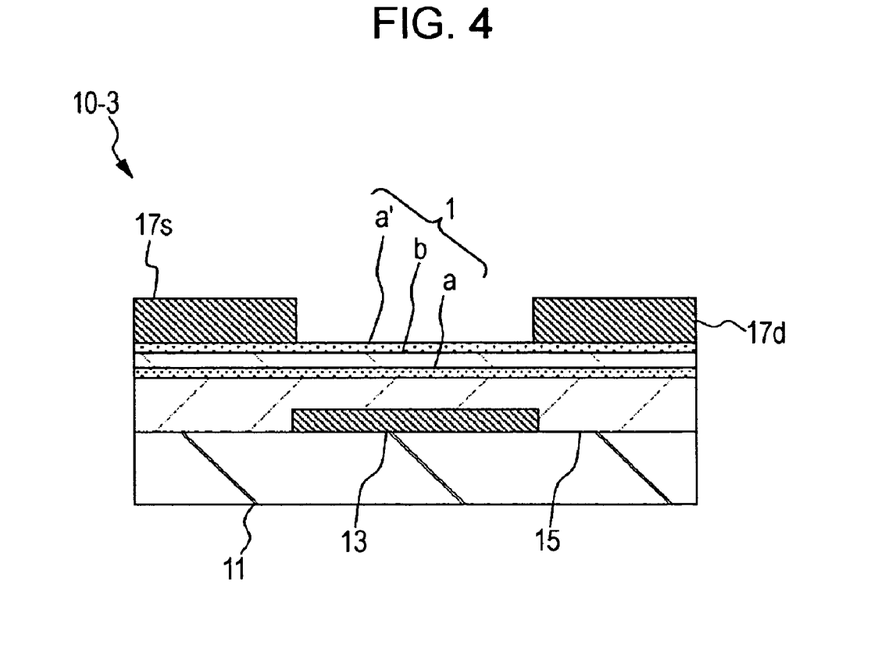
FIG. 4 is a sectional configuration view illustrating a third example of a thin-film semiconductor device to which the present invention is applied.

FIG. 4 is a sectional configuration view illustrating a third example of a thin-film semiconductor device to which the present invention is applied. A thin-film semiconductor device 10-3 illustrated in this figure is a thin-film transistor (field-effect transistor) of a top-contact bottom-gate (TCBG) type. The same constitutional elements as in the thin-film transistor (10-1) illustrated in FIG. 2 are designated with identical reference symbols;

The difference of the thin-film semiconductor device 10-3 of the third example illustrated in this figure from the thin-film transistor (10-1) of the first example illustrated in FIG. 2 is the order in which the semiconductor thin film 1, the source electrode 17*s*, and the drain electrode 17*d* are laminated. The other configuration is the same as in the first example.

Specifically, the source electrode 17*s* and the drain electrode 17*d* are formed by patterning on the gate insulation film 15 with the semiconductor thin film 1 therebetween, the gate insulation film 15 covering the gate electrode 13 on the substrate 11. Thus, the above-described semiconductor thin film 1 is provided across the source electrode 17*s*—the drain electrode 17*d* in the state of being in contact with the gate insulation film 15, the source electrode 17*s*, and the drain electrode 17*d*.

In the thin-film semiconductor device 10-3 of the third example, one (herein, the semiconductor layer a) of a plurality of semiconductor layers constituting the above-described semiconductor thin film 1 is provided in the state of being in contact with the gate insulation film 15 and another (herein, the semiconductor layer a') is provided in the state of being in contact with the source electrode 17*s* and the drain electrode 17*d*.

Thus, also, in the thin-film semiconductor device 10-3 having such a configuration, by using the semiconductor thin film 1 described with FIG. 1 as an active layer, a decrease in the mobility caused by heating and degradation of characteristics caused by the decrease are suppressed and the heat resistance can be enhanced as in the first example.

<Thin-Film Semiconductor Device—4>

Figure 5:
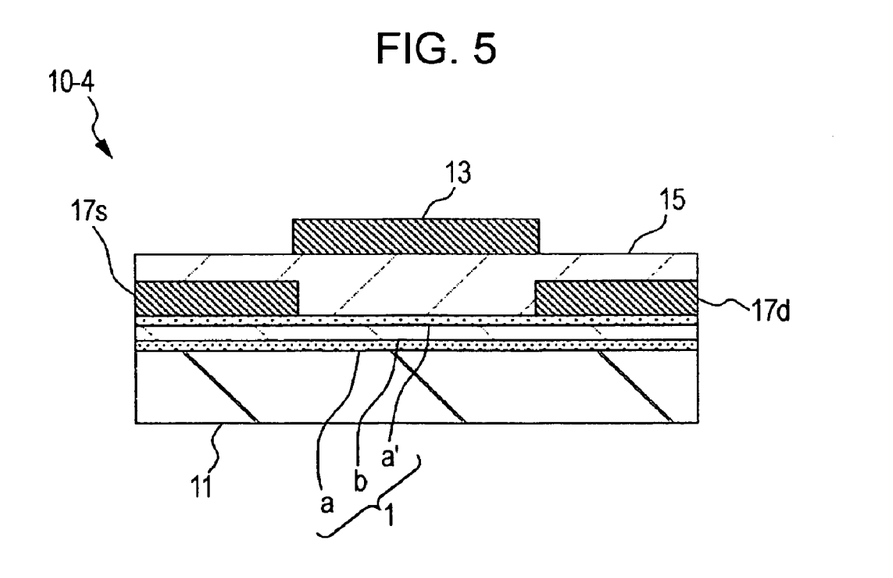
FIG. 5 is a sectional configuration view illustrating a fourth example of a thin-film semiconductor device to which the present invention is applied.

FIG. 5 is a sectional configuration view illustrating a fourth example of a thin-film semiconductor device to which the present invention is applied. A thin-film semiconductor device 10-4 illustrated in this figure is a thin-film transistor (field-effect transistor) of a top-contact top-gate (TCTG) type. The same constitutional elements as in the thin-film transistor (10-1) illustrated in FIG. 2 are designated with identical reference symbols.

The difference of the thin-film semiconductor device 10-4 of the fourth example illustrated in this figure from the thin-film transistor (10-1) of the first example illustrated in FIG. 2 is that the order in which the constitutional elements are laminated is reversed. The other configuration is the same as in the first example.

Specifically, the source electrode 17*s* and the drain electrode 17*d* are formed by patterning on the substrate 11 with the semiconductor thin film 1 therebetween and the gate insulation film 15 is provided in the state of covering this. The gate electrode 13 is formed by patterning on the gate insulation film 15 in the position between the source electrode 17*s*—the drain electrode 17*d*.

In such a configuration, as in the first example, a state is provided in which the above-described semiconductor thin film 1 is provided across the source electrode 17*s*—the drain electrode 17*d* in the state of being in contact with the gate insulation film 15, the source electrode 17*s*, and the drain electrode 17*d*; and the semiconductor layer a', which is one among the semiconductor thin film 1 having a trilayer structure, is provided in the state of being in contact with the source electrode 17*s*, the gate insulation film 15, and the drain electrode 17*d*.

Thus, also, in the thin-film semiconductor device 10-4 having such a configuration, by using the semiconductor thin film 1 described with FIG. 1 as an active layer, a decrease in the mobility caused by heating and degradation of characteristics caused by the decrease are suppressed and the heat resistance can be enhanced as in the first example.

<Thin-Film Semiconductor Device—5>

Figure 6:
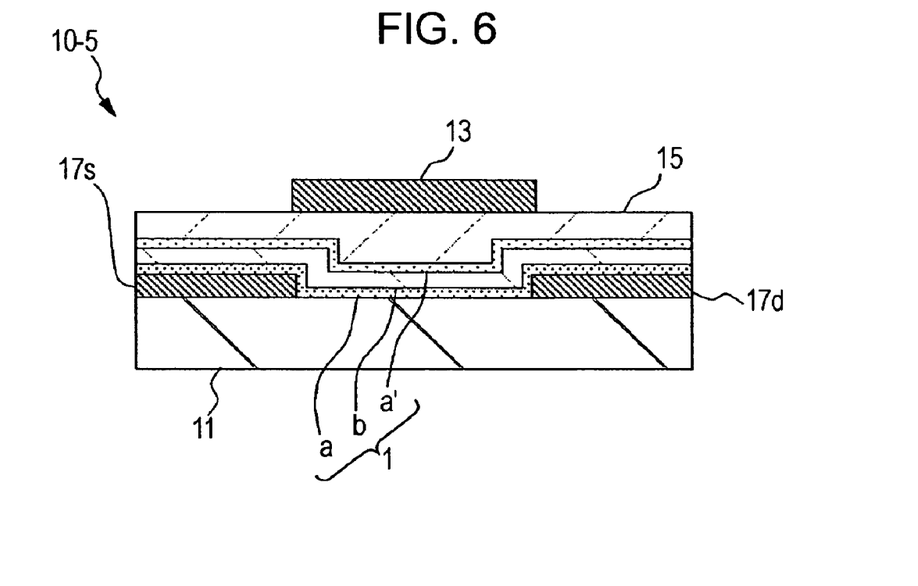
FIG. 6 is a sectional configuration view illustrating a fifth example of a thin-film semiconductor device to which the present invention is applied.

FIG. 6 is a sectional configuration view illustrating a fifth example of a thin-film semiconductor device to which the present invention is applied. A thin-film semiconductor device 10-5 illustrated in this figure is a thin-film transistor (field-effect transistor) of a bottom-contact top-gate (BCTG) type. The same constitutional elements as in the thin-film transistor (10-1) illustrated in FIG. 2 and FIG. 5 are designated with identical reference symbols.

The thin-film semiconductor device 10-5 of the fifth example illustrated in this figure is the order in which the semiconductor thin film 1, the source electrode 17*s*, and the drain electrode 17*d* are laminated in the thin-film transistor (10-4) of the fourth example illustrated in FIG. 5. The other configuration is the same as in the fourth example.

Specifically, the source electrode 17*s* and the drain electrode 17*d* are formed by patterning on the substrate 11 and the semiconductor thin film 1 is provided in the state of covering this. The gate insulation film 15 is provided on the semiconductor thin film 1. Furthermore, the gate electrode 13 is formed by patterning on the gate insulation film 15 in the position between the source electrode 17*s*—the drain electrode 17*d*.

In the thin-film semiconductor device 10-5 of the fifth example, one (herein, the semiconductor layer a') of a plurality of semiconductor layers constituting the above-described semiconductor thin film 1 is provided in the state of being in contact with the gate insulation film 15 and another (herein, the semiconductor layer a) is provided in the state of being in contact with the source electrode 17*s* and the drain electrode 17*d*.

Thus, also, in the thin-film semiconductor device 10-5 having such a configuration, by using the semiconductor thin film 1 described with FIG. 1 as an active layer, a decrease in the mobility caused by heating and degradation of characteristics caused by the decrease are suppressed and the heat resistance can be enhanced as in the first example.

<Thin-Film Semiconductor Device—6>

Figure 7:
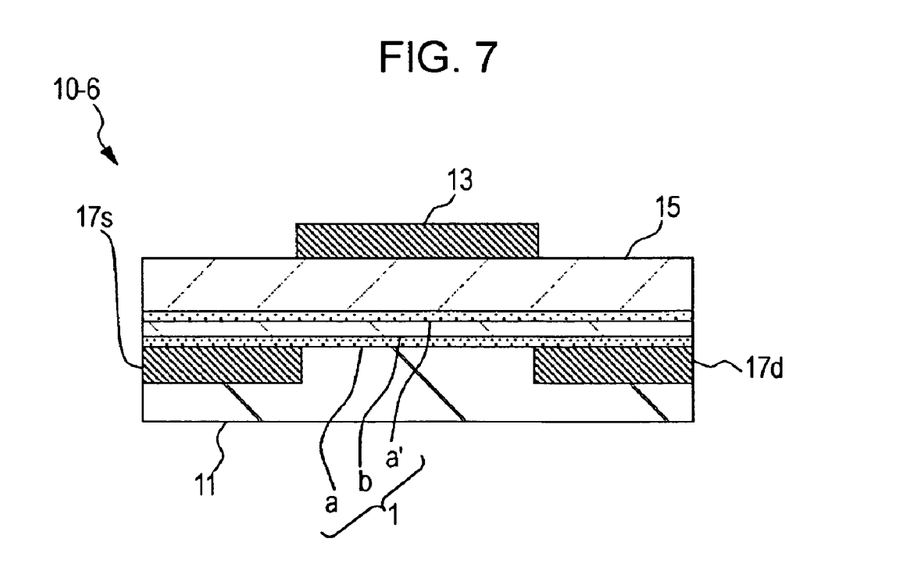
FIG. 7 is a sectional configuration view illustrating a sixth example of a thin-film semiconductor device to which the present invention is applied.

FIG. 7 is a sectional configuration view illustrating a sixth example of a thin-film semiconductor device to which the present invention is applied. A thin-film semiconductor device 10-6 illustrated in this figure is a first modification example of the thin-film transistor (field-effect transistor) of the bottom-contact top-gate (BCTG) type of the fifth example. The only difference from the fifth example is that the surfaces of the source electrode 17s and the drain electrode 17d constitute the same plane with a surface of the substrate 11.

<Thin-Film Semiconductor Device—7>

Figure 8:
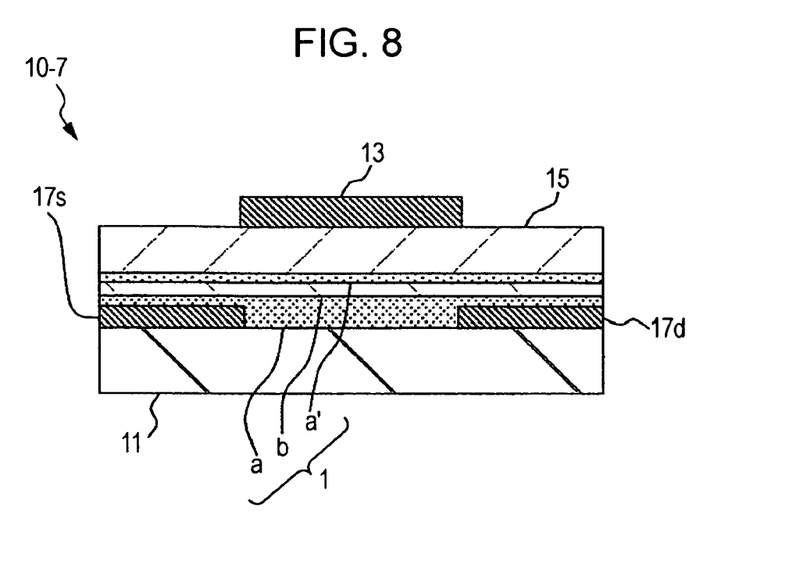
FIG. 8 is a sectional configuration view illustrating a seventh example of a thin-film semiconductor device to which the present invention is applied.

FIG. 8 is a sectional configuration view illustrating a seventh example of a thin-film semiconductor device to which the present invention is applied. A thin-film semiconductor device 10-7 illustrated in this figure is a second modification example of the thin-film transistor (field-effect transistor) of the bottom-contact top-gate (BCTG) type of the fifth example. The only difference from the fifth is that the semiconductor layer a constituting the semiconductor thin film 1 is formed as a film filling the stepped pattern of the source electrode 17s and the drain electrode 17d to provide a flat surface.

Note that the thin-film semiconductor devices of the embodiments having been described above are further covered with interlayer insulation films and passivation films in accordance with the need, wired, and used.

EXAMPLES

Example 1 of Semiconductor Thin Film

The semiconductor thin film illustrated in FIG. 1 was formed as described below. First, a solution in which TIPS pentacene (6,13-bis(triisopropylsilylethynyl)pentacene: organic semiconductor material) and poly(α-methylstyrene) (poly(α-methylstyrene): Mw=108,000, Mn=106,000: organic insulation material) were mixed and dissolved in mesitylene was prepared. Next, a coating film was formed by coating the prepared solution by spin-coating on a substrate in which the surface is constituted by an organic insulation film mainly composed of crosslinked PVP (polyvinyl phenol). The formed coating film was dried under a nitrogen atmosphere at 60° C. for one hour to provide a thin film.

Figure 9:
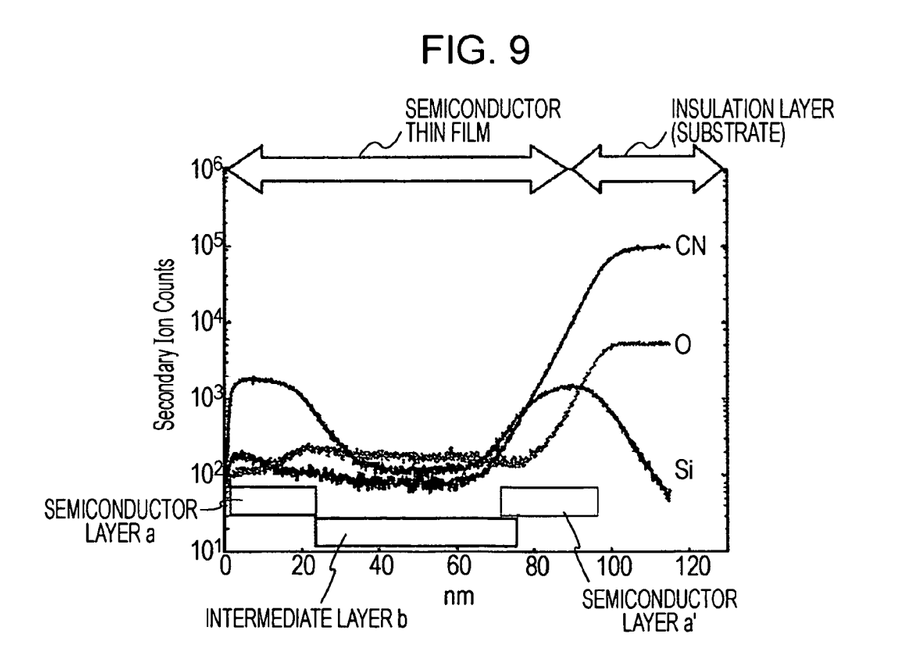
FIG. 9 is a SIMS profile of a semiconductor thin film produced as EXAMPLE 1.

The resultant thin film was measured by TOF-SIMS in terms of the concentration profile in the depth direction. This result is shown in FIG. 9. As illustrated in this figure, the peaks of Si contained in TIPS pentacene were detected at two separate positions of a near-surface position and a near-interface position of the insulation layer (substrate). From this, it was confirmed that TIPS pentacene, which was an organic semiconductor material, and poly(a-methylstyrene), which was an organic insulation material, were brought into phase separation in the drying process of the above-described coating solution and the semiconductor thin film 1 having a layered configuration in which the intermediate layer b mainly composed of poly(α-methylstyrene) is sandwiched between the semiconductor layers a-a' composed of TIPS pentacene containing Si as illustrated in FIG. 1 was obtained. Note that CN and O in FIG. 9 are components of the organic insulation film constituting the surface of the substrate.

Comparative Example 1 of Semiconductor Thin Film

In the processes of the above-described <EXAMPLE 1>, the molecular weight of the organic insulation material was adjusted to poly(α-methylstyrene) (Mw=2,200, Mn=1,960). Other than this, a thin film was obtained by processes similar to those in <EXAMPLE 1>.

Figure 10:
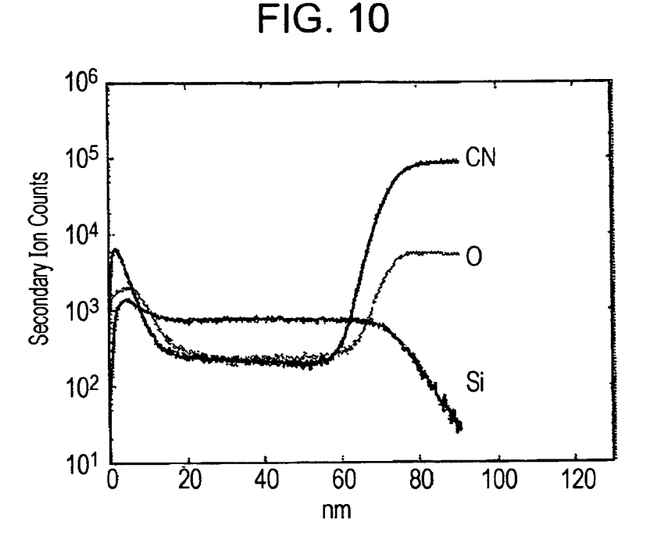
FIG. 10 is a SIMS profile of a semiconductor thin film produced as COMPARATIVE EXAMPLE 1.

The resultant thin film was measured by TOF-SIMS in terms of the concentration profile in the depth direction. This result is shown in FIG. 10. As illustrated in this figure, Si contained in TIPS pentacene was slightly nonuniformly distributed in the most superficial portion but was detected substantially uniformly in the surface-side of the insulation layer (substrate) in which CN and O were detected in high concentrations. From this, it was confirmed that TIPS pentacene, which was an organic semiconductor material, and poly(α-methylstyrene), which was an organic insulation material, were not brought into phase separation in the drying process of the above-described coating solution and only a thin film having a monolayer structure in which these were substantially uniformly mixed in the thin was obtained.

Thus, from the above results of <EXAMPLE 1> and <COMPARATIVE EXAMPLE 1>, it has been confirmed that, by adjusting the molecular weight of an organic material (in particular, herein, an organic insulation material) constituting a solution, a layered film in which organic materials has been spontaneously brought into phase separation in a coating film is obtained.

Example 2 of Semiconductor Thin Film

The semiconductor thin film illustrated in FIG. 1 was formed as described below. First, a solution in which TIPS pentacene (organic semiconductor material) and a cyclic-olefin copolymer (organic insulation material) were mixed and dissolved in mesitylene was prepared. Next, a coating film was formed by coating the prepared solution by spin-coating on a substrate having an organic insulation film mainly composed of crosslinked PVP (polyvinyl phenol). The formed coating film was dried under a nitrogen atmosphere at 60° C. for one hour to provide a thin film.

Figure 11:
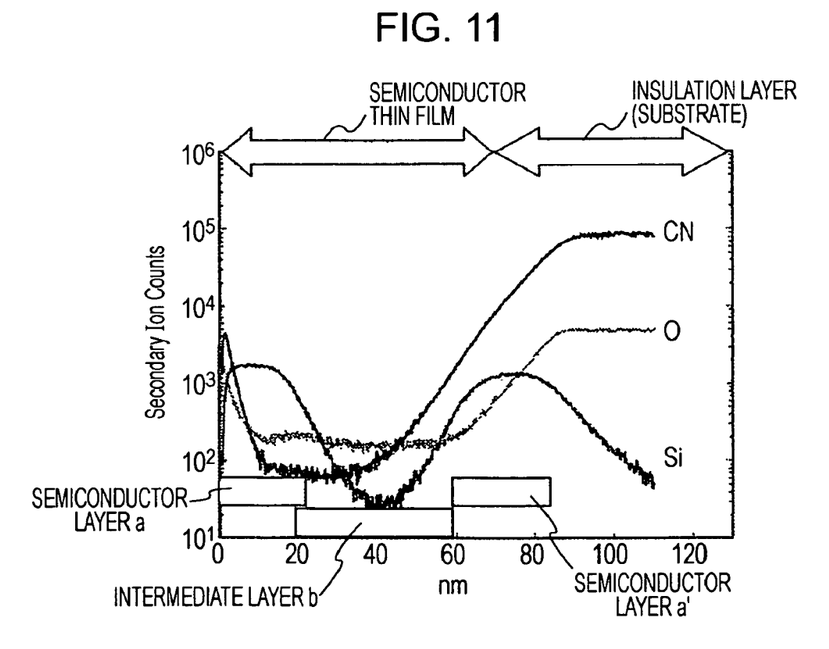
FIG. 11 is a SIMS profile of a semiconductor thin film produced as EXAMPLE 2.

The resultant thin film was measured by TOF-SIMS in terms of the concentration profile in the depth direction. This result is shown in FIG. 11. As illustrated in this figure, the peaks of Si contained in TIPS pentacene were detected at two separate positions of a near-surface position and a near-interface position of the insulation layer (substrate). From this, it was confirmed that TIPS pentacene, which was an organic semiconductor material, and poly(α-methylstyrene), which was an organic insulation material, were brought into phase separation in the drying process of the above-described coating film and the semiconductor thin film 1 having a layered configuration in which the intermediate layer b composed of the cyclic-olefin copolymer was sandwiched between the semiconductor layers a-a' composed of TIPS pentacene containing Si as illustrated in FIG. 1 was obtained.

Furthermore, from comparison with <EXAMPLE 1> above, it has been confirmed that the phase separation of an organic semiconductor material and an organic insulation material in a coating film is not restricted to the case where an aromatic hydrocarbon compound such as poly(α-methylstyrene) is used as the organic insulation material and also occurs with an olefin-based high-molecular material without having an aromatic ring.

Comparative Example 2 of Semiconductor Thin Film

In the processes of the above-described <EXAMPLE 1>, a solution in which only TIPS pentacene (organic semiconductor material) without an organic insulation material was dissolved in mesitylene was used. Other than this, a semiconductor thin film having a monolayer structure composed of only TIPS pentacene was formed by processes similar to those in <EXAMPLE 1>.

<Evaluation of Semiconductor Thin Films>

Figure 12:
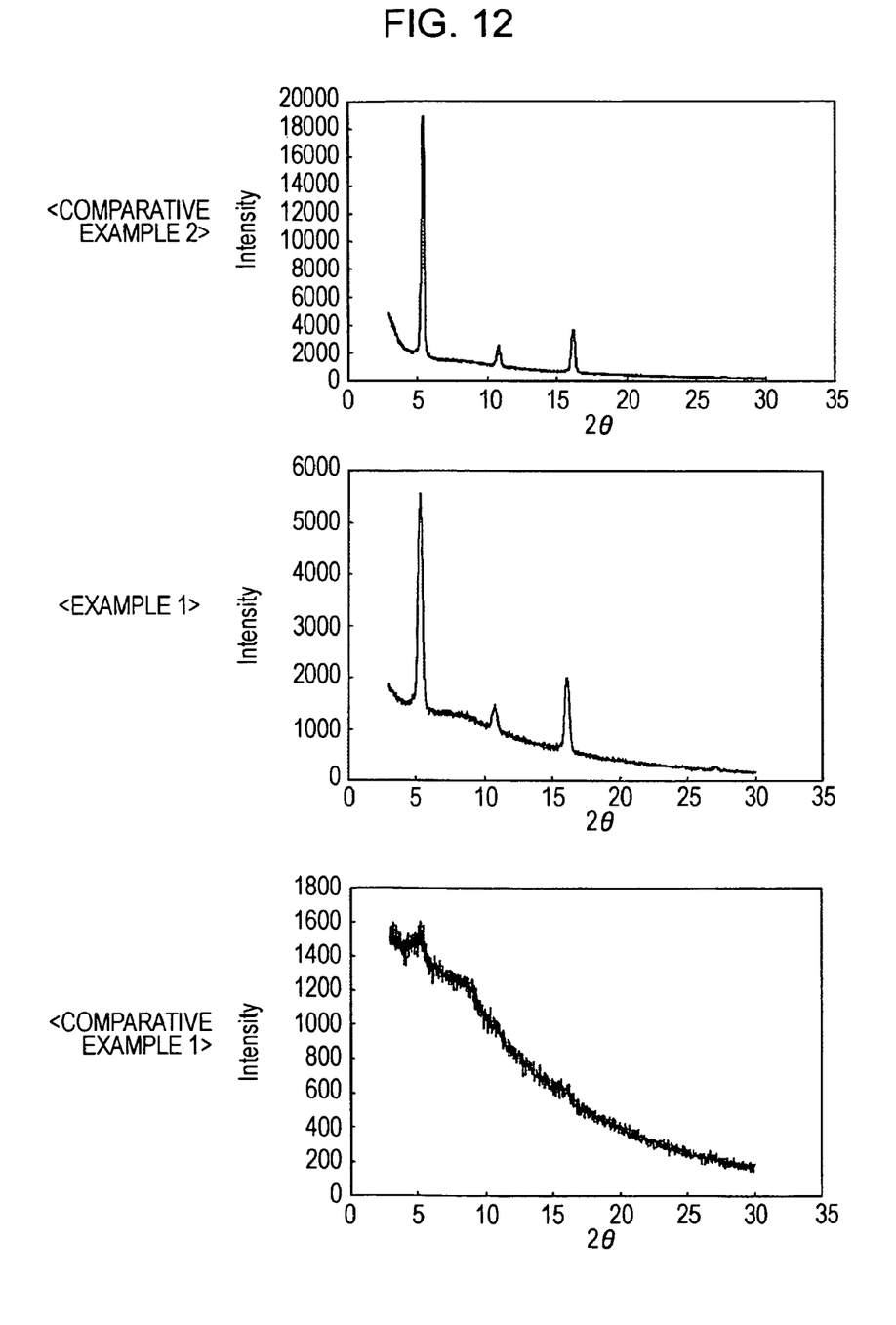
FIG. 12 is XRD spectra of semiconductor thin films produced as COMPARATIVE EXAMPLE 2, EXAMPLE 1, and COMPARATIVE EXAMPLE 1.

The X-ray diffraction spectra of the semiconductor thin film of <COMPARATIVE EXAMPLE 2> produced above and the semiconductor thin films of <EXAMPLE 1> and <COMPARATIVE EXAMPLE 1> described above were measured. This result is shown in FIG. 12. As illustrated in these figures, <EXAMPLE 1> in which TIPS pentacene, which was an organic semiconductor material, and poly(α-methylstyrene), which was an organic insulation material, were brought into phase separation exhibited the same spectrum as the <COMPARATIVE EXAMPLE 2> having a monolayer structure composed of only TIPS pentacene. From this, it was confirmed that the arrangement state of TIPS pentacene in the semiconductor layers a, a' in the semiconductor thin film 1 produced in <EXAMPLE 1> was maintained so as to be the same as the arrangement state in the monolayer structure composed of TIPS pentacene produced in <COMPARATIVE EXAMPLE 2>.

In contrast, in a thin film that was produced in <COMPARATIVE EXAMPLE 1> and had a monolayer structure in which TIPS pentacene and poly(α-methylstyrene) were substantially uniformly mixed, there was no peak in the X-ray diffraction spectrum, which shows that TIPS pentacene was not arranged in the film and the molecular arrangement was in disorder.

Example of Device

As described below, a thin-film transistor (field-effect transistor) of the bottom-contact bottom-gate (BCBG) type described with FIG. 2 was produced.

First, a 3-inch Si wafer was used as a common gate electrode 13. The gate insulation film 15 constituted by an organic insulation film was formed in the upper portion of the gate electrode 13 and 87 or more patterns of the source electrode 17s and drain electrode 17d were formed on the gate insulation film 15. Next, the semiconductor thin film 1 having a layered structure was formed by processes similar to those in <EXAMPLE 1> above the gate insulation film 15 on which the source electrode 17s and the drain electrode 17d were formed. Specifically, a solution in which TIPS pentacene (organic semiconductor material) and poly(α-methylstyrene) (Mw=108,000, Mn=106,000: organic insulation material) were mixed and dissolved in mesitylene was coated by spin-coating to form a coated solution. The formed coated solution was dried under a nitrogen atmosphere at 60° C. for one hour to form the semiconductor thin film 1 having a layered structure. Thus, the thin-film transistor in FIG. 2 to which the present invention was applied was obtained.

Comparative Example of Device

A thin-film transistor was produced by processes similar to those in <EXAMPLE of device> except that processes of <COMPARATIVE EXAMPLE 2> were applied to the formation of the semiconductor thin film. Specifically, in the formation of the semiconductor thin film, a solution in which only TIPS pentacene (organic semiconductor material) without an organic insulation material was mixed and dissolved in mesitylene was used to form a semiconductor thin film having a monolayer structure composed of only TIPS pentacene. Other than this, a thin-film transistor was produced by processes similar to those in <EXAMPLE of device>.

<Evaluation of Device—1>

Figure 13:
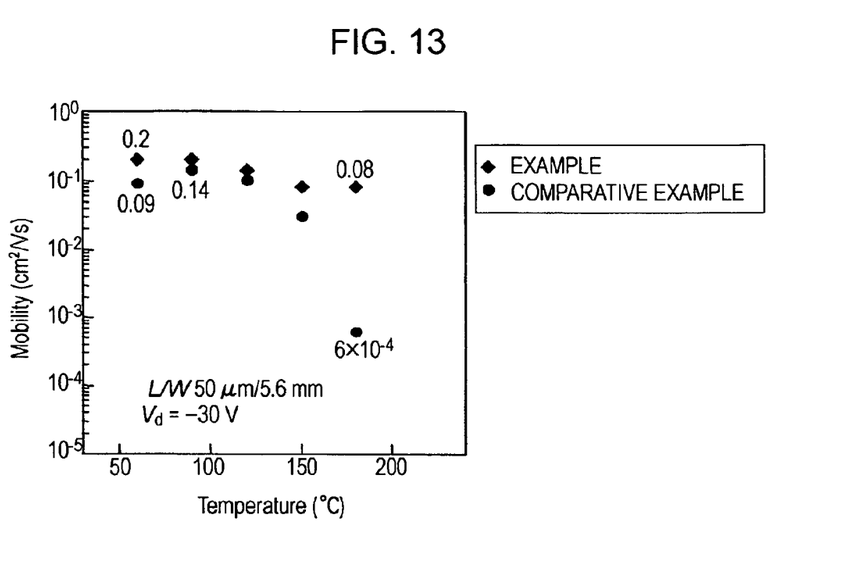
FIG. 13 is a graph illustrating variation in mobility according to heating temperature in thin-film transistors (field-effect transistors) produced as EXAMPLE and COMPARATIVE EXAMPLE of devices.

Thin-film transistors produced in <EXAMPLE of device> and <COMPARATIVE EXAMPLE of device> above were measured in terms of variation in mobility (Mobility) according to heating temperature under a nitrogen atmosphere. This result is shown in FIG. 13. As illustrated in this figure, in the thin-film transistor obtained in <EXAMPLE of device>, the initial mobility of 0.2 cm$^2$/Vs decreased by heating; however, a mobility of about 0.08 cm$^2$/Vs was maintained even under heating to 180° C. In contrast, the thin-film transistor obtained in <COMPARATIVE EXAMPLE of device>, the initial mobility of 0.09 cm$^2$/Vs decreased by heating and was degraded to a mobility of about 6×10$^{-4}$ cm$^2$/Vs at 180° C.

This shows that, in the thin-film transistor obtained in <EXAMPLE of device> to which the present invention was applied, the initial mobility was high and a decrease in the mobility was suppressed to a small degree even in the state of being heated to 180° C., compared with the thin-film transistor obtained in <COMPARATIVE EXAMPLE of device>.

Thus, it has been confirmed that, by making the semiconductor thin film 1 to have a layered structure by the application of the present invention, a decrease in the mobility caused by heating and degradation of characteristics caused by the decrease can be suppressed, and a semiconductor thin film and a thin-film semiconductor device that have an enhanced heat resistance can be obtained.

Note that, such suppression of degradation of the mobility is probably achieved because, as one cause, expansion of the semiconductor thin film caused by heating is suppressed by the layered structure. That is, there is expansion and contraction caused by heat as one physical change caused by addition of heat. A thin-film transistor can be seen as a structure in which organic substances having different material properties are layered. The layers have different thermal expansion coefficients and addition of heat may cause stress between the layers. For example, when metal Ma and metal Mb having different thermal expansion coefficients are bonded together, it is known that the member that is flat at room temperature warps at high temperature. This phenomenon is caused because expansion ratios are different between the upper portion and the lower portion. However, there is a case where this warping can be avoided with a sandwich structure of Ma-Mb-Ma. This is probably because, although stress is caused between the metals Ma-Mb, the sandwich structure reduces stress caused by thermal expansion between the upper portion and the lower portion when seen as one plate.

Accordingly, the semiconductor thin film 1 is not restricted to those composed by organic materials shown in EXAMPLES and it is expected that the semiconductor thin film 1 composed by inorganic materials provides similar advantages.

Furthermore, when a semiconductor thin film is produced by coating, it is known that the drying step of the solvent considerably influences the performance of the characteristics of a thin-film transistor. For example, it has been reported that use of a coating solvent having a higher boiling point can provide a thin-film transistor having a high mobility (refer to "Chem. Mater.", 16(23), 2004, p. 4772-4776). This is probably because use of a coating solvent having a high boiling point decreases the drying speed of the coating solvent in the drying step.

Furthermore, when the same coating solvent (mesitylene) is used for forming semiconductor thin films as in <EXAMPLE of device> and <COMPARATIVE EXAMPLE of device> above, it has been visually confirmed that the drying speed of the coating solvent in the drying process of the coating film in <EXAMPLE of device> decreases. This is probably because mixing of poly(α-methylstyrene) (Mw=108,000, Mn=106,000), which is a high-molecular material having a sufficiently higher molecular weight than TIPS pentacene, with TIPS pentacene (organic semiconductor material), which is an organic semiconductor material, hampers volatilization of the coating solvent and, as a result, the drying becomes slow. Thus, with such a decrease in the drying speed serving as a cause, a thin-film transistor having an enhanced mobility was probably obtained.

<Evaluation of Device—2>

Among a plurality of thin-film transistors produced as in <EXAMPLE of device> and <COMPARATIVE EXAMPLE of device> above, 87 thin-film transistors each in <EXAMPLE of device> and <COMPARATIVE EXAMPLE of device> were measured in terms of variation in ON-state current. As a result, the variation in ON-state current of the thin-film transistors produced as in <EXAMPLE of device> was 11.3%. On the other hand, the variation in ON-state current of the thin-film transistors produced as in <COMPARATIVE EXAMPLE of device> was 54.7%.

Thus, by forming a semiconductor thin film having a layered structure with spontaneous phase separation in the formation of a semiconductor thin film to which a spin-coating method is applied, it has been confirmed that the effect of suppressing the variation of ON-state current to about $\frac{1}{5}$ compared with the case where a semiconductor thin film is formed with a single organic semiconductor material.

<Evaluation of Device—3>

Figure 14:
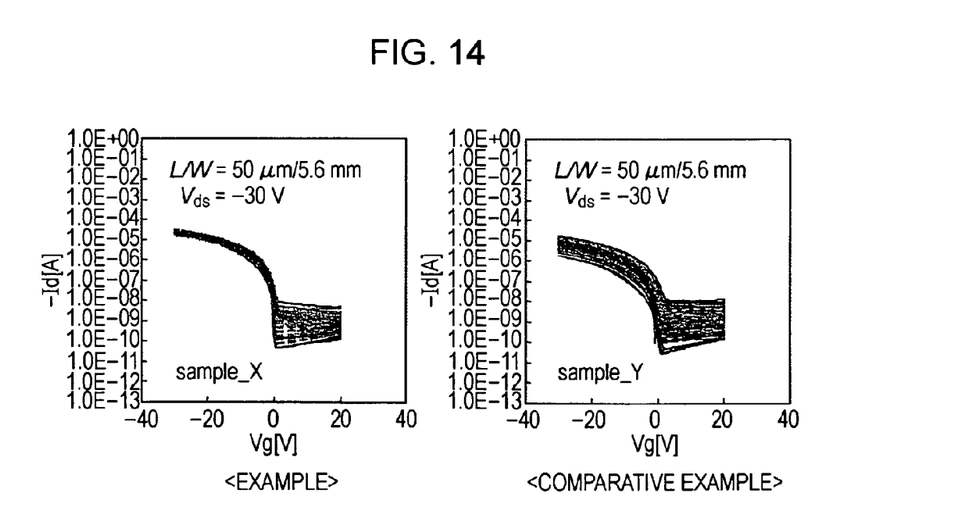
FIG. 14 is graphs illustrating the gate voltage Vg—drain current Id characteristic of thin-film transistors (field-effect transistors) produced as EXAMPLE and COMPARATIVE EXAMPLE of devices.

Furthermore, among a plurality of thin-film transistors produced as in <EXAMPLE of device> and <COMPARATIVE EXAMPLE of device>, 87 thin-film transistors each in <EXAMPLE of device> and <COMPARATIVE EXAMPLE of device> were measured in terms of the gate voltage Vg—drain current Id characteristic. The result is shown in FIG. 14. From this result, it has also been confirmed that variation in the characteristic of thin-film transistors produced as in, <EXAMPLE of device> was smaller than the variation in the characteristic of thin-film transistors produced as in <COMPARATIVE EXAMPLE of device>.

From the results of <Evaluation of device—2>and <Evaluation of device—3>above, it has been confirmed that, by mixing poly(α-methylstyrene) (Mw=108,000, Mn=106,000), which is a high-molecular material having a sufficiently higher molecular weight than TIPS pentacene, with TIPS pentacene (organic semiconductor material), which is an organic semiconductor material, a viscosity to a degree can be provided to a solution for coating and coatability is enhanced, agglomeration in the drying process of a coating film is further suppressed, and hence a semiconductor thin film having in-plane uniformity is obtained.

As has been described above, according to the present invention, a decrease in the mobility caused by heating and degradation of characteristics caused by the decrease can be suppressed in a thin-film semiconductor device and a field-effect transistor, and the heat resistance can be enhanced.

The invention claimed is:

1. A thin-film semiconductor device comprising:
a semiconductor thin film laminated on a gate electrode with a gate insulation film therebetween,
wherein the semiconductor thin film has a layered structure and includes at least two semiconductor layers,
wherein an intermediate layer mainly composed of a material different from the at least two semiconductor layers is sandwiched between the at least two semiconductor layers, and
wherein the layered structure is composed of an organic material.

2. The thin-film semiconductor device according to claim 1,
wherein the at least two semiconductor layers are composed of identical materials.

3. The thin-film semiconductor device according to claim 1,
wherein the intermediate layer is composed of an insulation material.

4. The thin-film semiconductor device according to claim 1,
wherein the at least two semiconductor layers are each a conjugated-type low-molecular material and the intermediate layer is a high-molecular material.

5. The thin-film semiconductor device according to claim 4,
wherein the conjugated low-molecular material is polycrystalline or crystalline and the high-molecular material is amorphous.

6. The thin-film semiconductor device according to claim 4,
wherein the high-molecular material is a high-molecular insulation material.

7. The thin-film semiconductor device according to claim 1,
wherein the layered structure is constituted by, in sequence from the gate insulation film side, a first conjugated-type low-molecular material layer, a high-molecular material layer, and a second conjugated-type low-molecular material layer.

8. The thin-film semiconductor device according to claim 7,
wherein the first conjugated-type low-molecular material layer and the second conjugated-type low-molecular material layer are each polycrystalline or crystalline and the high-molecular material layer is amorphous.

9. The thin-film semiconductor device according to claim 7,
wherein the high-molecular material layer is a high-molecular insulation material.

10. A field-effect transistor comprising:
a semiconductor thin film laminated on a gate electrode with a gate insulation film therebetween; and
a source electrode and a drain electrode provided in positions corresponding to both sides of the gate electrode so as to be in contact with the semiconductor thin film,
wherein the semiconductor thin film has a layered structure and includes at least two semiconductor layers,
wherein an intermediate layer mainly composed of a material different from the at least two semiconductor layers is sandwiched between the at least two semiconductor layers, and
wherein the layered structure is composed of an organic material.

* * * * *